(12) United States Patent
Kim et al.

(10) Patent No.: US 9,627,647 B2
(45) Date of Patent: Apr. 18, 2017

(54) ORGANIC LIGHT-EMITTING DIODE DISPLAY AND MANUFACTURING METHOD THEREOF

(71) Applicant: SAMSUNG DISPLAY CO., LTD., Yongin, Gyeonggi-Do (KR)

(72) Inventors: Jaehyun Kim, Yongin (KR); Yongjun Park, Yongin (KR); Cheho Lee, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 62 days.

(21) Appl. No.: 14/818,384

(22) Filed: Aug. 5, 2015

(65) Prior Publication Data
US 2016/0093828 A1 Mar. 31, 2016

(30) Foreign Application Priority Data
Sep. 25, 2014 (KR) .................. 10-2014-0128286

(51) Int. Cl.
*H01L 51/52* (2006.01)

(52) U.S. Cl.
CPC ...... *H01L 51/5253* (2013.01); *H01L 2251/55* (2013.01); *H01L 2251/558* (2013.01)

(58) Field of Classification Search
None
See application file for complete search history.

(56) References Cited

U.S. PATENT DOCUMENTS

| | | | |
|---|---|---|---|
| 7,504,332 B2 * | 3/2009 | Won | C23C 8/36 257/E21.17 |
| 8,389,983 B2 * | 3/2013 | Seo | H01L 51/5256 257/100 |
| 8,872,207 B2 * | 10/2014 | Jeong | H01L 51/5275 257/100 |
| 8,946,691 B2 * | 2/2015 | Lee | H01L 51/5088 257/100 |
| 9,065,070 B2 * | 6/2015 | Kim | H01L 51/5237 |
| 2004/0113542 A1 * | 6/2004 | Hsiao | H01L 51/5253 313/504 |
| 2007/0267973 A1 * | 11/2007 | Suh | H01L 51/5256 313/512 |
| 2008/0018230 A1 * | 1/2008 | Yamada | B32B 27/00 313/498 |

(Continued)

FOREIGN PATENT DOCUMENTS

| KR | 10-2011-0058126 A | 6/2011 |
|---|---|---|
| KR | 10-2013-0123236 A | 11/2013 |
| KR | 10-2014-0066552 A | 6/2014 |

*Primary Examiner* — Lex Malsawma
(74) *Attorney, Agent, or Firm* — Lee & Morse, P.C.

(57) ABSTRACT

An organic light-emitting diode display includes an organic light-emitting display device including a first electrode, an intermediate layer including an organic emission layer, and a second electrode; a first inorganic encapsulation layer on the second electrode; a second inorganic encapsulation layer on the first inorganic encapsulation layer; and an organic encapsulation layer on the second inorganic encapsulation layer. A refractive index of the first inorganic encapsulation layer is higher than a refractive index of the second inorganic encapsulation layer. The first inorganic encapsulation layer has an extinction coefficient of 0.02 to 0.07 and a refractive index of 2.1 to 2.3 at a blue wavelength.

18 Claims, 5 Drawing Sheets

(56) References Cited

U.S. PATENT DOCUMENTS

| | | | |
|---|---|---|---|
| 2008/0169758 A1* | 7/2008 | Cok | H01L 51/5262 313/506 |
| 2009/0267487 A1* | 10/2009 | Kwack | H01L 51/5259 313/503 |
| 2010/0272945 A1* | 10/2010 | Nam | H01L 51/448 428/76 |
| 2011/0121271 A1 | 5/2011 | Jeon et al. | |
| 2012/0175636 A1 | 7/2012 | Ihara | |
| 2012/0228668 A1* | 9/2012 | Thoumazet | C23C 16/0245 257/100 |
| 2012/0248422 A1* | 10/2012 | Mine | H01L 51/5256 257/40 |
| 2012/0256218 A1* | 10/2012 | Kwack | H01L 51/5256 257/98 |
| 2013/0059155 A1 | 3/2013 | Choi et al. | |
| 2013/0168644 A1* | 7/2013 | Park | H01L 51/5234 257/40 |
| 2013/0210199 A1* | 8/2013 | Chen | C23C 16/26 438/127 |
| 2013/0334511 A1* | 12/2013 | Savas | H01L 51/56 257/40 |
| 2014/0024180 A1* | 1/2014 | Choi | H01L 21/02107 438/127 |
| 2014/0145154 A1 | 5/2014 | Kim et al. | |
| 2015/0108445 A1* | 4/2015 | Schicktanz | H01L 51/5203 257/40 |
| 2015/0115229 A1* | 4/2015 | Jung | H01L 51/0097 257/40 |

\* cited by examiner

ORGANIC LIGHT-EMITTING DIODE DISPLAY AND MANUFACTURING METHOD THEREOF

CROSS-REFERENCE TO RELATED APPLICATION

Korean Patent Application No. 10-2014-0128286, filed on Sep. 25, 2014, in the Korean Intellectual Property Office, and entitled: "Organic Light-Emitting Diode Display and Manufacturing Method Thereof," is incorporated by reference herein in its entirety.

BACKGROUND

1. Field

One or more exemplary embodiments relate to an organic light-emitting diode display and a manufacturing method thereof.

2. Description of the Related Art

Display apparatuses are apparatuses for displaying images. Among the display apparatuses, an organic light-emitting diode display has recently drawn much attention.

Unlike a liquid crystal device, the organic light-emitting diode display has self-emitting characteristics and, thus, may be thinner and lighter weight, as an additional light source is not needed. Also, the organic light-emitting diode display has high-quality characteristics, e.g., low power consumption, high brightness, high response speed, etc.

SUMMARY

According to one or more exemplary embodiments, an organic light-emitting diode display includes an organic light-emitting display device including a first electrode, an intermediate layer including an organic emission layer, and a second electrode; a first inorganic encapsulation layer on the second electrode; a second inorganic encapsulation layer on the first inorganic encapsulation layer; and an organic encapsulation layer on the second inorganic encapsulation layer, wherein a refractive index of the first inorganic encapsulation layer is higher than a refractive index of the second inorganic encapsulation layer, and the first inorganic encapsulation layer has an extinction coefficient of about 0.02 to about 0.07 and a refractive index of about 2.1 to about 2.3 at a blue wavelength.

The first inorganic encapsulation layer may have a thickness of about 500 Å to about 1000 Å.

A difference between the refractive indexes of the first and second inorganic encapsulation layers may be about 0.6 to about 0.9.

The first and second inorganic encapsulation layers may be formed of a silicon-based material.

The first inorganic encapsulation layer may include a silicon nitride (SiNx).

The first inorganic encapsulation layer may be directly formed on the second electrode.

The organic light-emitting diode display may further include a third inorganic encapsulation layer interposed between the second inorganic encapsulation layer and the organic encapsulation layer.

The first inorganic encapsulation layer, the second inorganic encapsulation layer, and the third inorganic encapsulation layer may be formed of a silicon-based material.

A difference between a refractive index of the third inorganic encapsulation layer and a refractive index of the organic encapsulation layer may be less than about 0.3, and a difference between the refractive index of the third inorganic encapsulation layer and the refractive index of the second inorganic encapsulation layer may be less than about 0.3.

According to one or more exemplary embodiments, a method of manufacturing an organic light-emitting diode display includes forming a first inorganic encapsulation layer on an organic light-emitting display device having an extinction coefficient of about 0.02 to about 0.07 and a refractive index of about 2.1 to about 2.3 at a blue wavelength, wherein the organic light-emitting display device includes a first electrode; an intermediate layer formed on the first electrode and including an organic emission layer; and a second electrode formed on the intermediate layer; forming a second inorganic encapsulation layer on the first inorganic encapsulation layer, wherein a refractive index of the second inorganic encapsulation layer is lower than a refractive index of the first inorganic encapsulation layer; forming an organic encapsulation layer on the second inorganic encapsulation layer; and forming a third inorganic encapsulation layer on the organic encapsulation layer.

The forming of the first inorganic encapsulation layer and the forming of the second inorganic encapsulation layer may be performed in an in-situ process.

The first inorganic encapsulation layer and the second inorganic encapsulation layer may be formed by chemical vapor deposition.

The first inorganic encapsulation layer may have a thickness of about 500 Å to about 1000 Å.

The first inorganic encapsulation layer may include a silicon nitride (SiNx).

The refractive index of the second inorganic encapsulation layer may be lower by about 0.6 to about 0.9 than the refractive index of the first inorganic encapsulation layer.

The method may further include forming a third inorganic encapsulation layer on the second inorganic encapsulation layer before the forming of the organic encapsulation layer.

A difference between a refractive index of the third inorganic encapsulation layer and a refractive index of the organic encapsulation layer may be less than about 0.3, and a difference between the refractive index of the third inorganic encapsulation layer and the refractive index of the second inorganic encapsulation layer may be less than about 0.3.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
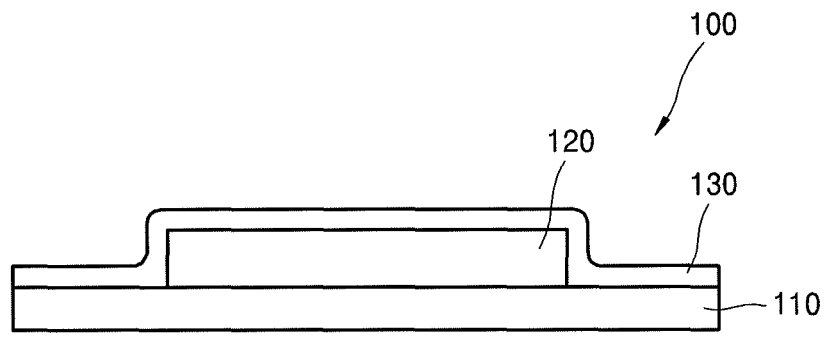
FIG. 1 illustrates a schematic cross-sectional view of an organic light-emitting diode display according to an embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description.

As used herein, the term "and/or" includes any and all combinations of one or more of the associated listed items.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprise" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

Figure 2:
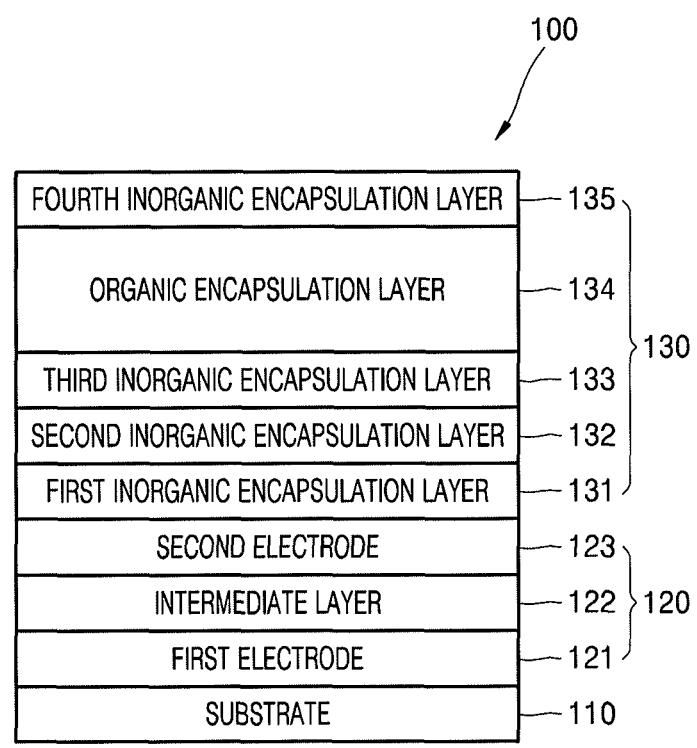
FIG. 2 illustrates a schematic cross-sectional view of a structure of an organic light-emitting diode display according to an embodiment.

FIG. 1 illustrates a schematic cross-sectional view of an organic light-emitting diode display 100 according to an embodiment. FIG. 2 illustrates a schematic cross-sectional view of a structure of the organic light-emitting diode display 100 according to an embodiment.

Referring to FIG. 1, the organic light-emitting diode display 100 according to an embodiment includes a substrate 110, an organic light-emitting display device (OLED) 120 on the substrate 110, and a thin-film encapsulation layer 130.

The substrate 110 may be a flexible substrate and may be formed of plastic having high heat-resistance and durable properties. For example, the substrate 110 may be formed of, e.g., polyethersulphone (PES), polyacrylate (PAR), polyetherimide (PEI), polyethyelenen napthalate (PEN), polyethyeleneterepthalate (PET), polyphenylene sulfide (PPS), polyarylate, polyimide (PI), polycarbonate (PC), cellulosetriacetate, cellulose acetate propionate (CAP), (poly (aryleneether sulfone)), and a combination thereof. However, embodiments are not limited thereto, e.g., the substrate 110 may be formed of other various materials such as a metal, glass, etc.

Although not shown, various elements/wire layers may be disposed on the substrate 110. The various elements/wire layers may include a drive thin-film transistor (TFT) for driving the OLED 120, a switching TFT, a capacitor, and wires connected to the TFTs or the capacitor.

Referring to FIGS. 1 and 2, the OLED 120 may be on the substrate 110, and includes a first electrode 121, an intermediate layer 122 formed on the first electrode 121 and including an organic emission layer, and a second electrode 123 formed on the intermediate layer 122.

The first electrode 121 may be a pixel electrode, e.g., an anode, and patterned in units of red (R), green (G), and blue (B) subpixels. The first electrode 121 may be a reflective electrode including, for example, a reflective film formed of Ag, Mg, Al, Pt, Pd, Au, Ni, Nd, Ir, Cr, or a combination thereof and a film disposed on the reflective film and formed of ITO, IZO, ZnO, or $In_2O_3$.

The intermediate layer 122 includes an organic emission layer including an organic material emitting red, blue, and green lights. The organic emission layer may include a low or high molecular weight organic material. The intermediate layer 122 may further selectively include a hole transport layer (HTL), a hole injection layer (HIL), an electron transport layer (ETL), and an electron injection layer (EIL), according to the type of the organic material included in the organic emission layer. For example, when the organic emission layer includes the low molecular weight organic material, an HTL, an HIL, an ETL, an EIL, and the like may be stacked around the organic emission layer. When the organic emission layer includes the high molecular weight organic material, the intermediate layer 122 may further include an HTL.

The second electrode 123 may be an opposite electrode, e.g., a cathode, and have a light transmittance property. The second electrode 123 may be a metal thin film having a low work function and formed of Li, Ca, LiF/Ca, LiF/Al, Al, Ag, Mg, or a combination thereof. The second electrode 123 may be a transparent thin film formed of ITO, IZO, ZnO, or $In_2O_3$.

In the present embodiment, the first electrode 121 is an anode and the second electrode 123 is a cathode but embodiments are not limited thereto. In another embodiment, the first electrode 121 may be a cathode and the second electrode 123 may be an anode according to a method of driving the organic light-emitting diode display 100. A hole and an electron are respectively injected from the first electrode 121 and the second electrode 123 into the organic emission layer. Light is generated when the injected hole and electron combine to form an exciton and the exciton drops from an excited state to its ground state.

The thin-film encapsulation layer 130 on the substrate 110 covers the OLED 120. Referring to FIG. 2, the thin-film encapsulation layer 130 may include a first inorganic encapsulation layer 131, a second inorganic encapsulation layer 132, a third inorganic encapsulation layer 133, an organic encapsulation layer 134, and a fourth inorganic encapsulation layer 135 that are formed on the second electrode 123.

The first inorganic encapsulation layer 131, the second inorganic encapsulation layer 132, and the third inorganic encapsulation layer 133 may include a silicon-based material and be formed in an in-situ process, thereby minimizing manufacturing costs and the number of processes. The first inorganic encapsulation layer 131 may include a silicon nitride (SiNx). The second inorganic encapsulation layer 132 may include a silicon oxide (SiOx). The third inorganic encapsulation layer 133 may include a silicon oxynitride (SiON).

The first inorganic encapsulation layer 131, the second inorganic encapsulation layer 132, and the third inorganic encapsulation layer 133 may be formed by chemical vapor deposition (CVD). For example, the first inorganic encapsulation layer 131, the second inorganic encapsulation layer 132, and the third inorganic encapsulation layer 133 may be formed by plasma-enhanced CVD (PECVD). When an inorganic encapsulation layer is formed by sputtering, the second electrode 123 may be damaged to cause black spots or the like to occur therein. Thus, a capping layer and a LiF layer formed of an organic material need to be formed between the second electrode 123 and the thin-film encapsulation layer 130. However, according to an embodiment, the first inorganic encapsulation layer 131, the second inorganic encapsulation layer 132, and the third inorganic encapsulation layer 133 may be formed by CVD to greatly reduce damage to the second electrode 123 when these inorganic encapsulation layers are formed. Thus, the thin-film encapsulation layer 130, e.g., the first inorganic encapsulation layer 131, may be directly formed on the second electrode 123 without forming a protective layer such as the capping layer or the LiF layer.

The organic encapsulation layer 134 may be formed on the third inorganic encapsulation layer 133. The organic encapsulation layer 134 may include a polymer-based material. The polymer-based material may be acryl-based resin, epoxy-based resin, polyimide, polyethylene, etc. The organic encapsulation layer 134 may lessen internal stress in the thin-film encapsulation layer 130, compensate for defects of the third and fourth inorganic encapsulation layers 133 and 135, and planarize the third and fourth inorganic encapsulation layers 133 and 135.

The fourth inorganic encapsulation layer 135 may be formed on the organic encapsulation layer 134. The fourth inorganic encapsulation layer 135 may include SiNx and be formed by CVD. The third and fourth inorganic encapsulation layers 133 and 135 are barrier layers that block external moisture and oxygen. External moisture and oxygen are primarily blocked by the fourth inorganic encapsulation layer 135 primarily blocks and secondarily blocked by the third inorganic encapsulation layer 133. Although two inorganic encapsulation layers, i.e., the third and fourth inorganic encapsulation layers 133 and 135, function as barriers in the present embodiment, only the fourth inorganic encapsulation layer 135 may function as a barrier in another exemplary embodiment.

In the organic light-emitting diode display 100 according to an exemplary embodiment, the inorganic encapsulation layers constituting the thin-film encapsulation layer 130 are formed to satisfy conditions which will be described below. Thus, the luminance efficiency of the organic light-emitting diode display 100 may be enhanced while minimizing the number of layers constituting the thin-film encapsulation layer 130. The characteristics of the inorganic encapsulation layers that increase the luminance efficiency of the organic light-emitting diode display 100 will be described in detail with reference to FIGS. 3 to 6 below.

A refractive index of the first inorganic encapsulation layer 131 may be set to be higher than that of the second inorganic encapsulation layer 132, so that light generated from the organic emission layer may be amplified by the first and second inorganic encapsulation layers 131 and 132, and emitted to the outside. Some of the light generated from the organic emission layer pass through the second electrode 123 and the thin-film encapsulation layer 130, and is then emitted toward the outside, and some of the light is reflected due to the difference between the refractive indexes of the first and second inorganic encapsulation layers 131 and 132 formed on the second electrode 123. The reflected light is reflected and amplified by the first electrode 121 and/or the second electrode 123. The luminance efficiency of the organic light-emitting diode display 100 may be improved due to such a resonance effect.

Figure 3:
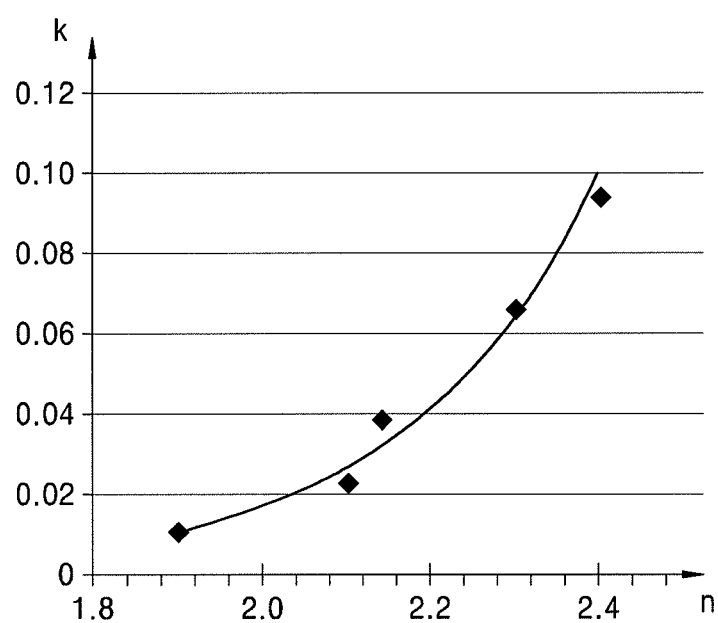
FIG. 3 illustrates a graph showing a change in an extinction coefficient versus a change in a refractive index of a first inorganic encapsulation layer according to an embodiment.
Figure 4:
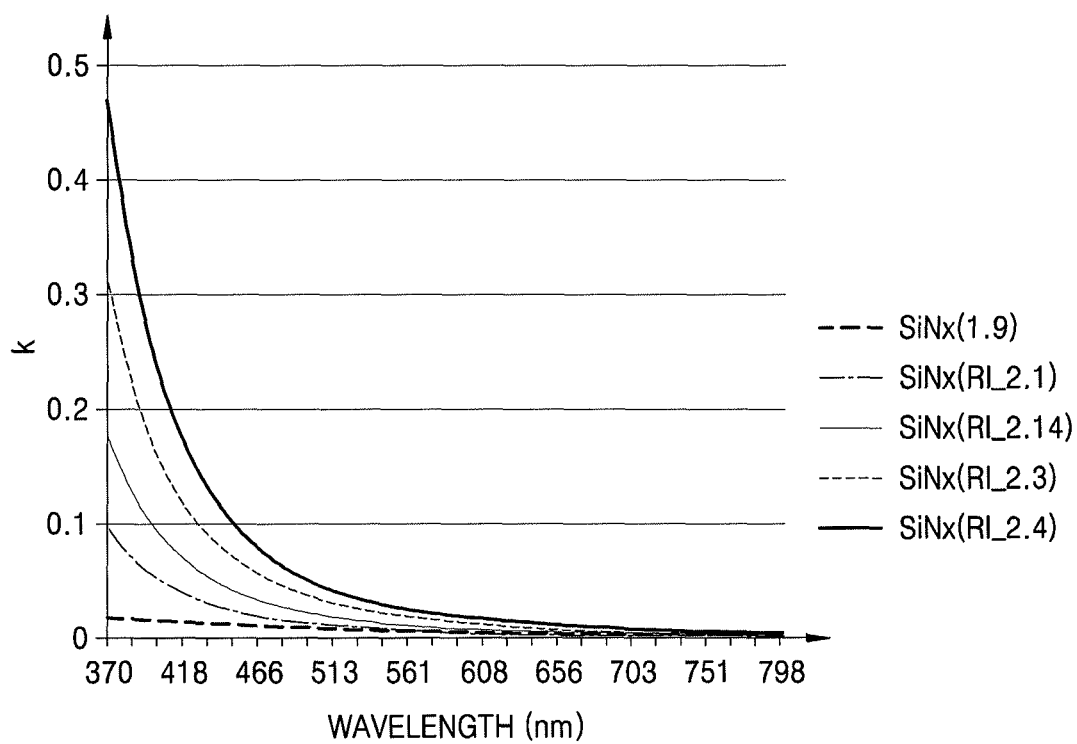
FIG. 4 illustrates a graph showing a change in an extinction coefficient versus a wavelength of light incident on a first inorganic encapsulation layer according to an embodiment.
Figure 5:
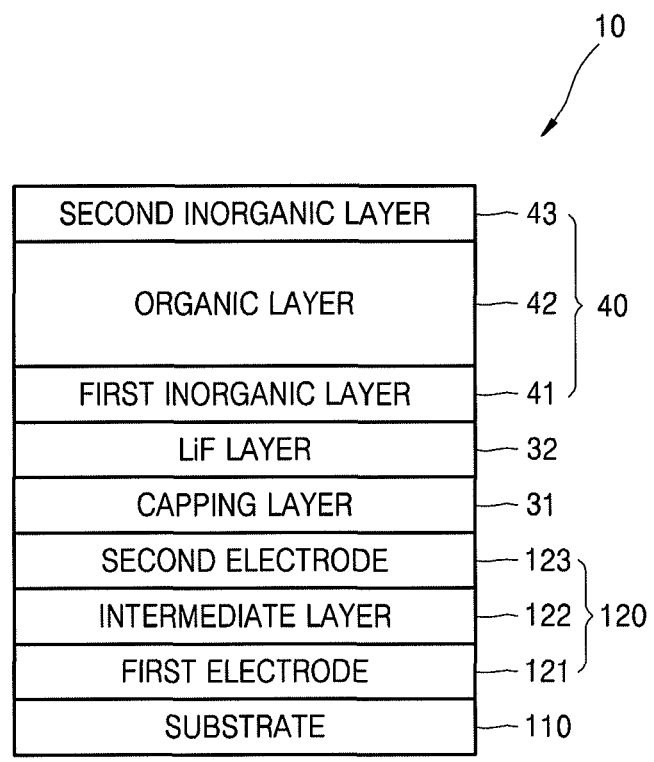
FIG. 5 illustrates a schematic cross-sectional view of a structure of an organic light-emitting diode display according to a comparative example.

The greater the difference between the refractive indexes of the first and second inorganic encapsulation layers 131 and 132, the greater the amount of light may be amplified due to the resonance effect. However, as illustrated in FIG. 3, an extinction coefficient k of the first inorganic encapsulation layer 131 tends to exponentially increase as a refractive index n thereof increases. As the refractive index n of the first inorganic encapsulation layer 131 increases, the amount of light absorbed by the first inorganic encapsulation layer 131 increases. Thus, a degree to which the luminous efficiency decreases when light is absorbed is greater than a degree to which the luminous efficiency increases when light resonates. This problem occurs to a large extent in a blue wavelength band of relatively short wavelengths as illustrated in FIG. 4.

To solve this problem, according to an exemplary embodiment, the first inorganic encapsulation layer 131 is formed such that the refractive index n thereof is in a range of 2.1 to 2.3 and the extinction coefficient k thereof is in a range of 0.02 to 0.07 at a blue wavelength range, the peak of which is 455 nm. When the refractive index n and the extinction coefficient k of the first inorganic encapsulation layer 131 are not within the above ranges, the luminous efficiency is lower by about 6% to 12% than an organic light-emitting diode display 10 having no light resonance structure of FIG. 5 according to a comparative example. The organic light-emitting diode display 10 of FIG. 5 according to the comparative example includes a capping layer 31 formed of an organic material, an LiF layer 32, and a thin-film encapsulation layer 40 that are sequentially formed on a second electrode 123. The thin-film encapsulation layer 40 includes a first inorganic layer 41, an organic layer 42, and a second inorganic layer 43.

Figure 6:
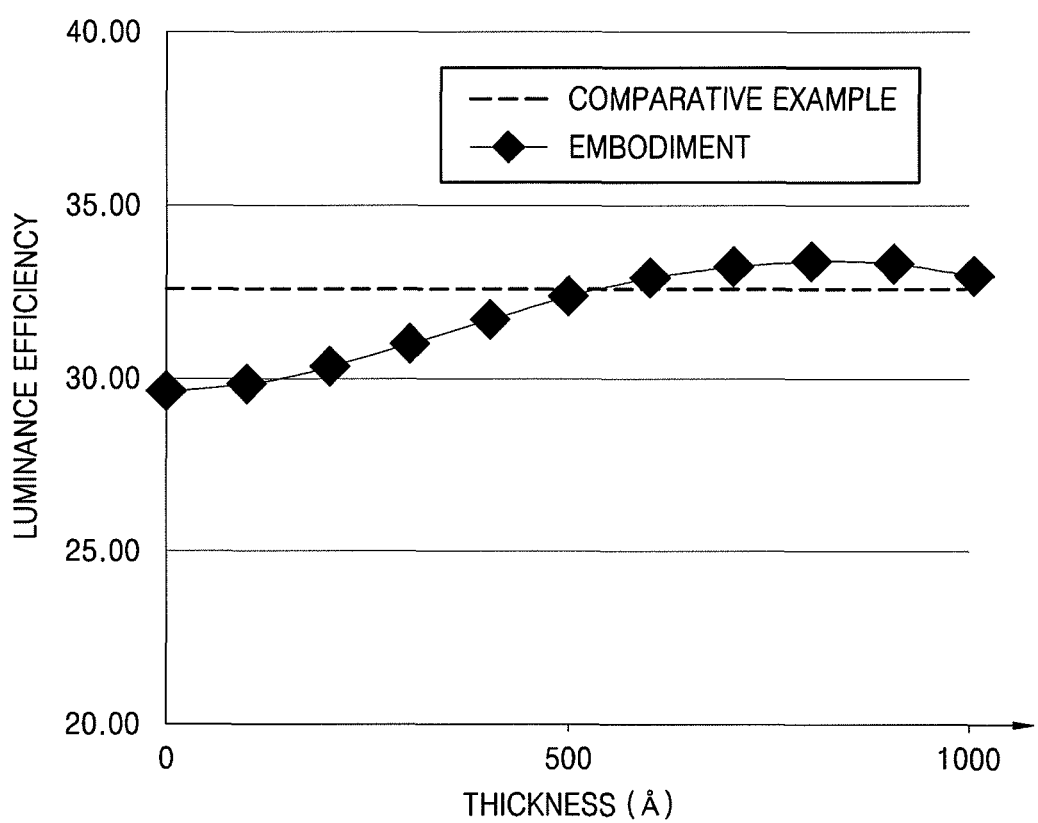
FIG. 6 illustrates a graph showing a change in luminance efficiency versus a change in a thickness of a first inorganic encapsulation layer according to an embodiment.

According to an exemplary embodiment, the first inorganic emission layer 131 may have a refractive index n of 2.1 to 2.3, an extinction coefficient k of 0.02 to 0.07 at a blue wavelength, and a thickness of about 500 Å to 1000 Å. When the thickness of the first inorganic emission layer 131 is not within the above ranges, the luminous efficiency of the organic light-emitting diode display 100 is lower than that of the organic light-emitting diode display 10 as illustrated in FIG. 6.

The second inorganic encapsulation layer 132 may be formed such that a refractive index thereof is lower than the refractive index n of the first inorganic encapsulation layer 131 and the difference between the refractive indexes of the first and second inorganic encapsulation layers 131 and 132 is 0.6 to 0.9. Since the refractive indexes vary according to a wavelength, degrees to which red, green, and blue lights are refracted increases greatly when the difference between the refractive indexes of the first and second inorganic encapsulation layers 131 and 132 is not within the above range. Accordingly, color shift may occur to a large extent at a side viewing angle.

The refractive index of the third inorganic encapsulation layer 133 may be set such that the differences between the refractive indexes of the third inorganic encapsulation layer 133 and layers adjacent thereto are the same or substantially the same. More specifically, the differences between the refractive indexes of the third inorganic encapsulation layer 133 and the adjacent layers, e.g., the second inorganic encapsulation layer 132 and/or the organic encapsulation layer 134, may be less than 0.3. When the differences between the refractive indexes of the third inorganic encapsulation layer 133 and the adjacent layers are equal to or greater than 0.3, light may be refracted to a large extent at interfaces between the third inorganic encapsulation layer 133 and the adjacent layers, thereby causing color deviation to occur at a side viewing angle and lowering the luminous efficiency.

According to the one or more embodiments, the thin-film encapsulation layer 130 may be directly formed on the OLED 120 without interposing the capping layer and LiF layer. Also, the organic light-emitting diode display 100, the luminous efficiency of which that is equal to or greater than that of the organic light-emitting diode display 10 according to the comparative example may be manufactured with a small number of processes and at low costs, compared to the organic light-emitting diode display 10.

As described above, according to the one or more of the above exemplary embodiments, the luminous efficiency of an organic light-emitting diode display may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting diode display, comprising:
an organic light-emitting display device including a first electrode, an intermediate layer including an organic emission layer, and a second electrode;
a first inorganic encapsulation layer on the second electrode;
a second inorganic encapsulation layer on the first inorganic encapsulation layer; and
an organic encapsulation layer on the second inorganic encapsulation layer,
wherein a refractive index of the first inorganic encapsulation layer is higher than a refractive index of the second inorganic encapsulation layer, and
wherein the first inorganic encapsulation layer has an extinction coefficient of about 0.02 to about 0.07 and a refractive index of about 2.1 to about 2.3 at a blue wavelength.

2. The organic light-emitting diode display as claimed in claim 1, wherein the first inorganic encapsulation layer has a thickness of about 500 Å to about 1000 Å.

3. The organic light-emitting diode display as claimed in claim 1, wherein a difference between the refractive indexes of the first and second inorganic encapsulation layers is about 0.6 to about 0.9.

4. The organic light-emitting diode display as claimed in claim 1, wherein the first and second inorganic encapsulation layers includes a silicon-based material.

5. The organic light-emitting diode display as claimed in claim 4, wherein the first inorganic encapsulation layer includes silicon nitride (SiNx).

6. The organic light-emitting diode display as claimed in claim 1, wherein the first inorganic encapsulation layer is directly on the second electrode.

7. The organic light-emitting diode display as claimed in claim 1, further comprising a third inorganic encapsulation layer between the second inorganic encapsulation layer and the organic encapsulation layer.

8. The organic light-emitting diode display as claimed in claim 7, wherein the first inorganic encapsulation layer, the second inorganic encapsulation layer, and the third inorganic encapsulation layer include a silicon-based material.

9. The organic light-emitting diode display as claimed in claim 7, wherein:
a difference between a refractive index of the third inorganic encapsulation layer and a refractive index of the organic encapsulation layer is less than about 0.3, and
a difference between the refractive index of the third inorganic encapsulation layer and the refractive index of the second inorganic encapsulation layer is less than about 0.3.

10. A method of manufacturing an organic light-emitting diode display, the method comprising:
forming a first inorganic encapsulation layer on an organic light-emitting display device having an extinction coefficient of about 0.02 to about 0.07 and a refractive index of about 2.1 to about 2.3 at a blue wavelength,
wherein the organic light-emitting display device comprises:
a first electrode;
an intermediate layer formed on the first electrode and including an organic emission layer; and
a second electrode formed on the intermediate layer;
forming a second inorganic encapsulation layer on the first inorganic encapsulation layer, wherein a refractive index of the second inorganic encapsulation layer is lower than a refractive index of the first inorganic encapsulation layer;
forming an organic encapsulation layer on the second inorganic encapsulation layer; and
forming a third inorganic encapsulation layer on the organic encapsulation layer.

11. The method as claimed in claim 10, wherein forming the first inorganic encapsulation layer and forming the second inorganic encapsulation layer are performed in an in-situ process.

12. The method as claimed in claim 10, wherein forming the first inorganic encapsulation layer and the second inorganic encapsulation layer includes chemical vapor deposition.

13. The method as claimed in claim 10, wherein the first inorganic encapsulation layer has a thickness of about 500 Å to about 1000 Å.

14. The method as claimed in claim 10, wherein the first inorganic encapsulation layer includes silicon nitride (SiNx).

15. The method as claimed in claim 10, wherein the refractive index of the second inorganic encapsulation layer is lower by about 0.6 to about 0.9 than the refractive index of the first inorganic encapsulation layer.

16. The method as claimed in claim 10, further comprising, before forming the organic encapsulation layer, forming a third inorganic encapsulation layer on the second inorganic encapsulation layer.

17. The method as claimed in claim 16, wherein:
a difference between a refractive index of the third inorganic encapsulation layer and a refractive index of the organic encapsulation layer is less than about 0.3, and
a difference between the refractive index of the third inorganic encapsulation layer and the refractive index of the second inorganic encapsulation layer is less than about 0.3.

18. The method as claimed in claim 10, wherein forming the first inorganic encapsulation layer includes directly forming the first inorganic encapsulation layer on the second electrode.

\* \* \* \* \*